(12) United States Patent
Sugino et al.

(10) Patent No.: US 6,482,720 B2
(45) Date of Patent: Nov. 19, 2002

(54) METHOD FOR MANUFACTURING COMPOUND SEMICONDUCTOR DEVICE

(75) Inventors: Takashi Sugino, Osaka (JP); Shigeru Nakajima, Kanagawa (JP)

(73) Assignee: Sumitomo Electric Industries, Ltd., Osaka (JP)

(*) Notice: Subject to any disclaimer, the term of this patent is extended or adjusted under 35 U.S.C. 154(b) by 11 days.

(21) Appl. No.: 09/842,319

(22) Filed: Apr. 26, 2001

(65) Prior Publication Data

US 2002/0055213 A1 May 9, 2002

(30) Foreign Application Priority Data

Apr. 27, 2000 (JP) .................................... 2000-128522

(51) Int. Cl.[7] .............................................. H01L 21/322
(52) U.S. Cl. ...................................... 438/474; 438/483
(58) Field of Search ................................. 438/474, 475, 438/483, 513, 518, 718

(56) References Cited

U.S. PATENT DOCUMENTS 5,024,706 A * 6/1991 Kanai et al.

FOREIGN PATENT DOCUMENTS

JP 10242096 9/1998

OTHER PUBLICATIONS

Hideaki Ninomiya, et al., "Effect of Phosphine on Plasma–Induced Traps in n–InP," Jpn. J. Appln. Phys., vol. 32, (1993),pp. L12–L15.

* cited by examiner

Primary Examiner—David Nelms
Assistant Examiner—Phuc T. Dang
(74) Attorney, Agent, or Firm—Smith, Gambrell & Russell, LLP

(57) ABSTRACT

In manufacturing compound semiconductor device, a plasma treatment is carried out by exposing surface of compound semiconductor material including AlAs or InAs exposing in atmosphere at manufacturing process in plasma of gas including any of P, N, H, and Ar at substrate temperature of less than 200° C. Desirably a second plasma treatment is carried out by exposing said compound semiconductor material in plasma of gas including p at higher substrate temperature continuously after said plasma treatment without taking the substrate out in air.

10 Claims, 6 Drawing Sheets

METHOD FOR MANUFACTURING COMPOUND SEMICONDUCTOR DEVICE

BACKGROUND OF THE INVENTION

1. Field of the Invention

The present invention relates to a method for manufacturing compound semiconductor device. Particularly the invention relates to a method for manufacturing semiconductor device using especially AlInAs compound, which prevents characteristic deterioration caused by invasion of F (fluorine) especially to compound semiconductor.

2. Description of the Related Art

AlInAs compound semiconductor is expected as semiconductor material for ultra high-speed device of next generation such as HEMT (high electron mobility transistor) and HBT (Hetero-junction Bipolar Transistor) because of high grating coordination to InP substrate and physical characteristic such as low trap density. However a problem is known that F (fluorine) taken out from environment atmosphere including air diffuses inside at heat treatment of manufacturing process and connects to donor such as Si so as to inactivate it.

That is, in HEMT, after loading a gate electrode, AlInAs layer exposes at periphery thereof and is exposed to air. In HBT, just before forming an emitter electrode, n-AlInAs sometime exposes. Further in case of separation between elements by mesa structure, it can not avoid that a section of AlInAs layer exposes at a sided face of mesa.

For such problem, a method is proposed that so called barrier layer by AlAs/InAs, In(AlGa)As, GaInAs, etc. is inserted into AlInAs or grown on upper layer. However as grating coordination is not formed in such method, barrier layer thicker than critical coat thickness is not formed so as not to depress enough invasion of F finally. Further there is not any effect against F invasion to the side face of mesa in case of mesa structure.

Although F removing by sealing by SiN coat or ammonium sulfide process is proposed else, actually the effect thereof is not obtained enough.

SUMMARY OF THE INVENTION

In order to solve the above-mentioned prior art, an object of the invention is to provide a method for manufacturing compound semiconductor device, which depresses effectively F invasion to compound semiconductor material including AlAs or InAs.

According to the invention, a method for manufacturing compound semiconductor device comprises a process carrying out plasma treatment exposing surface of compound semiconductor material including AlAs or InAs exposing in atmosphere at manufacturing process in plasma of gas including any of P (phosphorus), N (nitrogen), H (hydrogen), and Ar at substrate temperature of less than 200° C.

The method concerning the invention has a main characteristic in a point to carry out plasma treatment at low temperature less than 200° C. to exposed compound semiconductor material. By desirable mode of a method according to the invention, a second plasma treatment carried out continuously after the above-mentioned plasma treatment at higher temperature without exposing compound semiconductor material in air.

That is, there is a case frequently that F taken from air has already attached in exposed compound semiconductor material at actual manufacturing process of compound semiconductor. Therefore when substrate temperature is raised, the F invades into compound semiconductor material even for forming a protecting coat. Then it is important to remove F attaching at surface of the compound semiconductor with plasma treatment by gas including P or inactive gas of $N_2$, $H_2$, Ar, etc. at low temperature less than 200° C. which prevents invasion of F first. Here limitation of less than 200° C. of substrate temperature at plasma treatment is determined by that activation energy of F (fluorine) invasion is 1.0 eV. A carrier density change of n-AlInAs material due to the thermal annealing is defined by the following equitation (A paper titled "Degradation mechanism of the AlInAs/GaInAs high electron mobility transistor due to fluorine incorporation" written by N. Hayafuji et. al., published by Americal Institute of Physics, 1996, pages 4075–4077).:

$$n/n0 = \exp(-9180 \cdot t \cdot \exp(-1.0/kb \cdot T))$$

where, n: the concentration of free electron ($cm^{-3}$) in n-AlInAs material; n0: the initial concentration of free electron ($cm^{-3}$); kb: $8.617385 \cdot 10e-5[eV/K]$ (Boltzmann constant).

If the substrate temperature is 200° C. and the treatment time is one hour, i.e., T: 473 [K] and t: 3600 [sec], the carrier density change is calculated at 0.999 on the basis of the above-mentioned equation. That is, plasma treatment of less than 200° C. and within one hour depresses F invasion such that carrier density of AlInAs is changed, in other words, the amount of F invasion is 10% of the impurity amount of n-AlInAs or less.

Reason why surface-protecting coat by SiN proposed in related art does not obtain enough effect is assumed that F having attached before forming the surface-protecting coat has invaded into compound semiconductor material because substrate temperature is high at forming SiN coat.

After removing F of surface of compound semiconductor material as above-mentioned, stable compound is formed at surface of compound semiconductor material so as to stop new attachment or invasion of F when a second plasma treatment is carried out at normal high substrate temperature with gas including P, for example, phosphine (PH3) gas. It is desirable that the second plasma treatment is continuously carried out without exposing the compound semiconductor material from plasma treatment carried out at said low temperature so that cleaned surface of compound semiconductor material is not invaded again by F.

The above-mentioned plasma treatment is suitably carried out repeatedly at manufacturing process of compound semiconductor device. That is, in HEMT, n-AlInAs layer exposed at channel domain just before forming a gate electrode becomes an object of plasma treatment. In HBT, besides the plasma treatment is carried out about n-AlInAs layer before loading emitter electrode, plasma treatment is useful when side wall of mesa exposes showing head of the base.

Removing of F by ammonium sulfide treatment proposed in related art is assumed not to have enough effect because it is not avoided that compound semiconductor material is exposed again in air after the treatment.

DETAILED DESCRIPTION OF THE PREFERRED EMBODIMENT

Although the invention is described in detail referring figures below, the following disclosure is only an example and is not limited to the technical scope of the invention.

Figure 1:
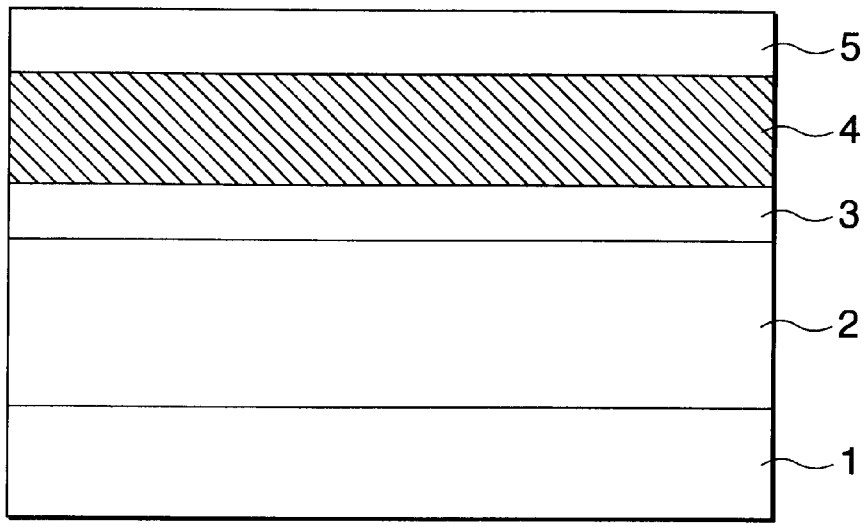
FIG. 1 is a section view showing a manufacturing process of HEMT one after another.
Figure 2:
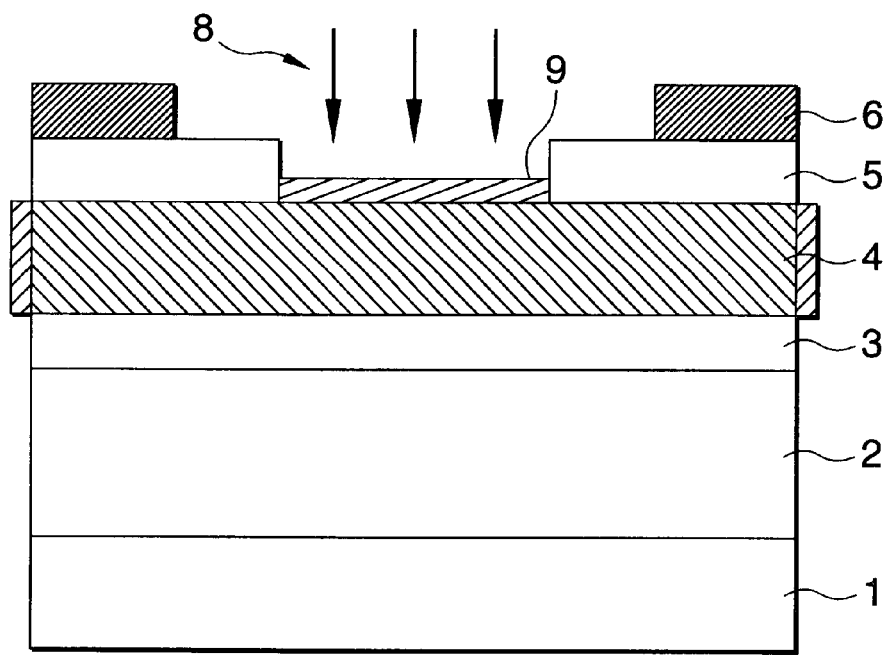
FIG. 2 is a section view showing a manufacturing process of HEMT one after another.
Figure 3:
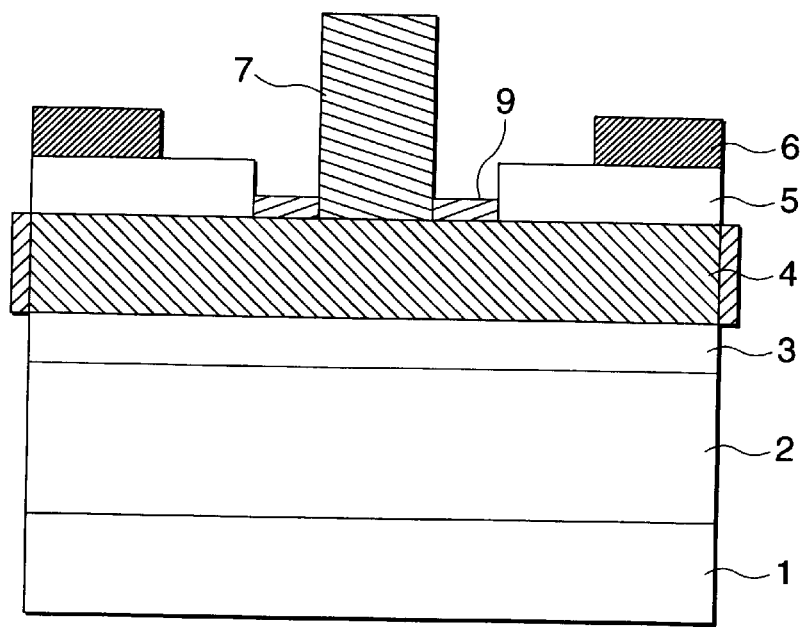
FIG. 3 is a section view showing a manufacturing process of HEMT one after another.

A manufacturing process of HEMT is shown in FIG. 1 to FIG. 3 as a concrete example of a method for manufacturing according to the invention.

As shown in FIG. 1, AlInAs buffer layer 2, InCaAs channel layer 3, n-AlInAs layer 4, and n+-AlInAs layer 5 are deposited on InP substrate 1 one by one. MBE method or OMVPE method forms each layer. Impurity such as $^{28}Si$ is added to the n-AlInAs layer 4 and the n+-AlInAs layer 5. Showing an example concretely, Si of $2 \cdot 10^{18}/cm^3$ is added to n-AlInAs layer 4 of 400 angstrom thickness, and Si of $1 \cdot 10^{19}/cm^3$ is added to n+-AlInAs layer 5 of 100 angstrom thickness.

Next, a pair of ohmic electrodes 6 is loaded on the n+-AlInAs layer 5 with AuGe as shown in FIG. 2. Although the ohmic electrodes 6 is formed by physical vapor growing method such as spattering method or deposition method, finally it is completed by that heat treatment is carried out and electrode metal and substrate material are alloyed at interface. Next, n+-AlInAs layer of gate domain is removed by etching. Result of that, as the n-AlInAs layer 4 exposes at gate domain, plasma treatment is carried out as the following.

That is, treatment radiating plasma 8 at substrate temperature of low temperature (less than 200° C.) with gas or inactive gas including P so as to remove F having attached already. Next, after raising enough substrate temperature (for example 250° C.) continuously without taking the substrate out, surface protecting coat 9 is formed treating gas including P with plasma 8. Thus besides surface of the gate domain becomes clean, the condition is kept even if taking it out in air. Considering a series of treatments, operation is simplified by using the same gas for low temperature plasma treatment and high temperature plasma treatment, for example, phosphine gas.

Finally as shown in FIG. 3, HEMT is completed loading a gate electrode 7 on the n-AlIAs layer 4 of the gate domain. The gate electrode is formed laminating Mo/Ti/Pt/Au or WSi/Ti/Au for example. Here at forming the gate electrode 7, it is desirable to remove the protecting coat with spattering by inactive gas of Ar, $N_2$, $H_2$, etc. first, and to form the gate electrode 7 next, and to forming again the protecting coat 9 carrying out plasma treatment continuously. By such a series of processes, clean state of the n-AlIAs layer 4 is kept.

In this embodiment, the low temperature plasma treatment and the high temperature plasma treatment are carried out before loading the gate electrode 7. The gate electrode may be loaded continuously after carrying out only the low temperature plasma treatment.

Figure 4:
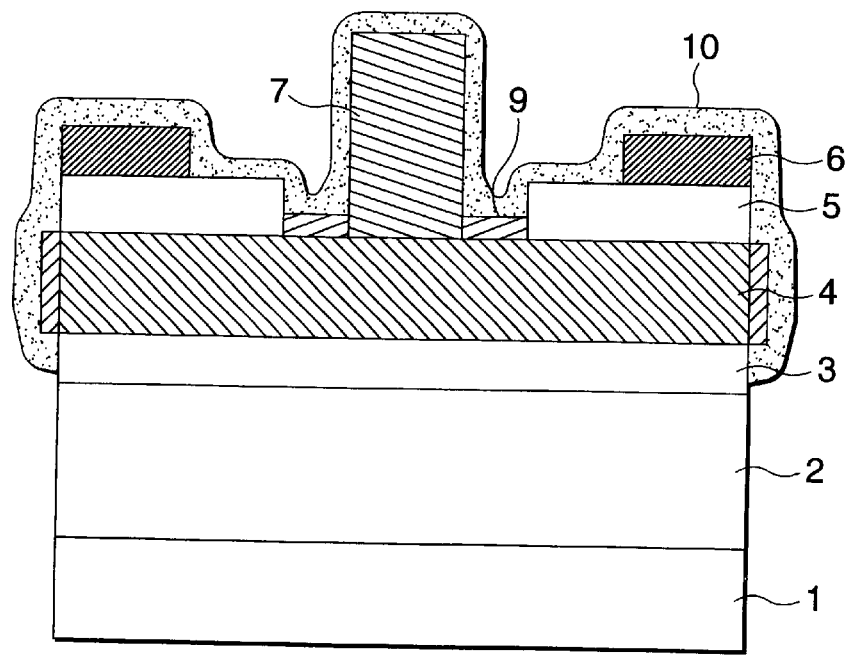
FIG. 4 is a section view showing a manufacturing process of HEMT one after another.

Further in the HEMT actually manufactured as shown in FIG. 4, there is a case to cover surface of the element with non-conductive coat 10 finally. Even in this case, it is desirable to carry out plasma treatment for forming the protecting coat 9 before forming the non-conductive coat 10. By carrying out such the treatment, durability of the semiconductor device improves more. The non-conductive coat may be formed continuously after carrying out only the low temperature plasma treatment.

Figure 5:
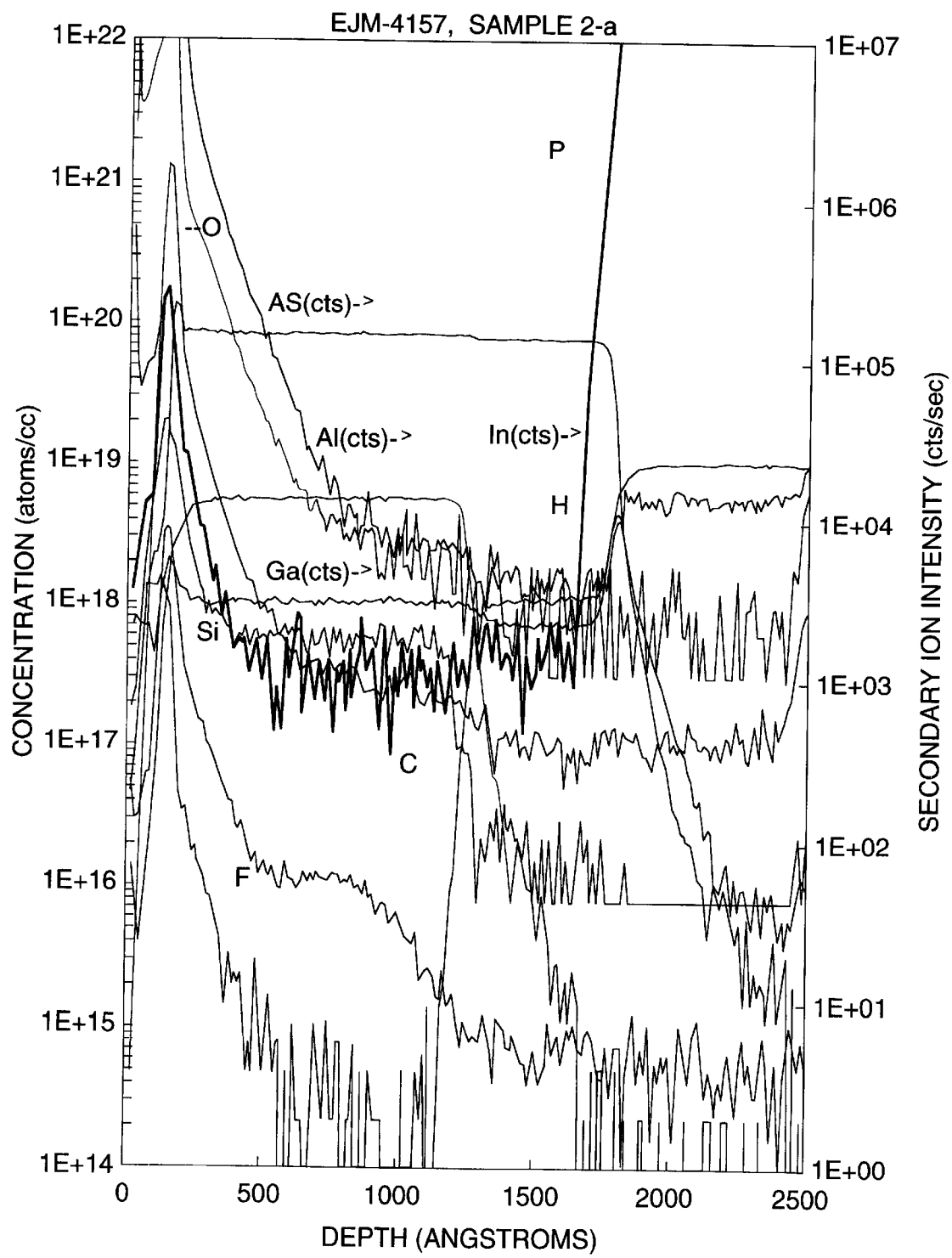
FIG. 5 is a graph showing result of measurement of F invasion at a compound semiconductor device manufactured according to the invention.
Figure 6:
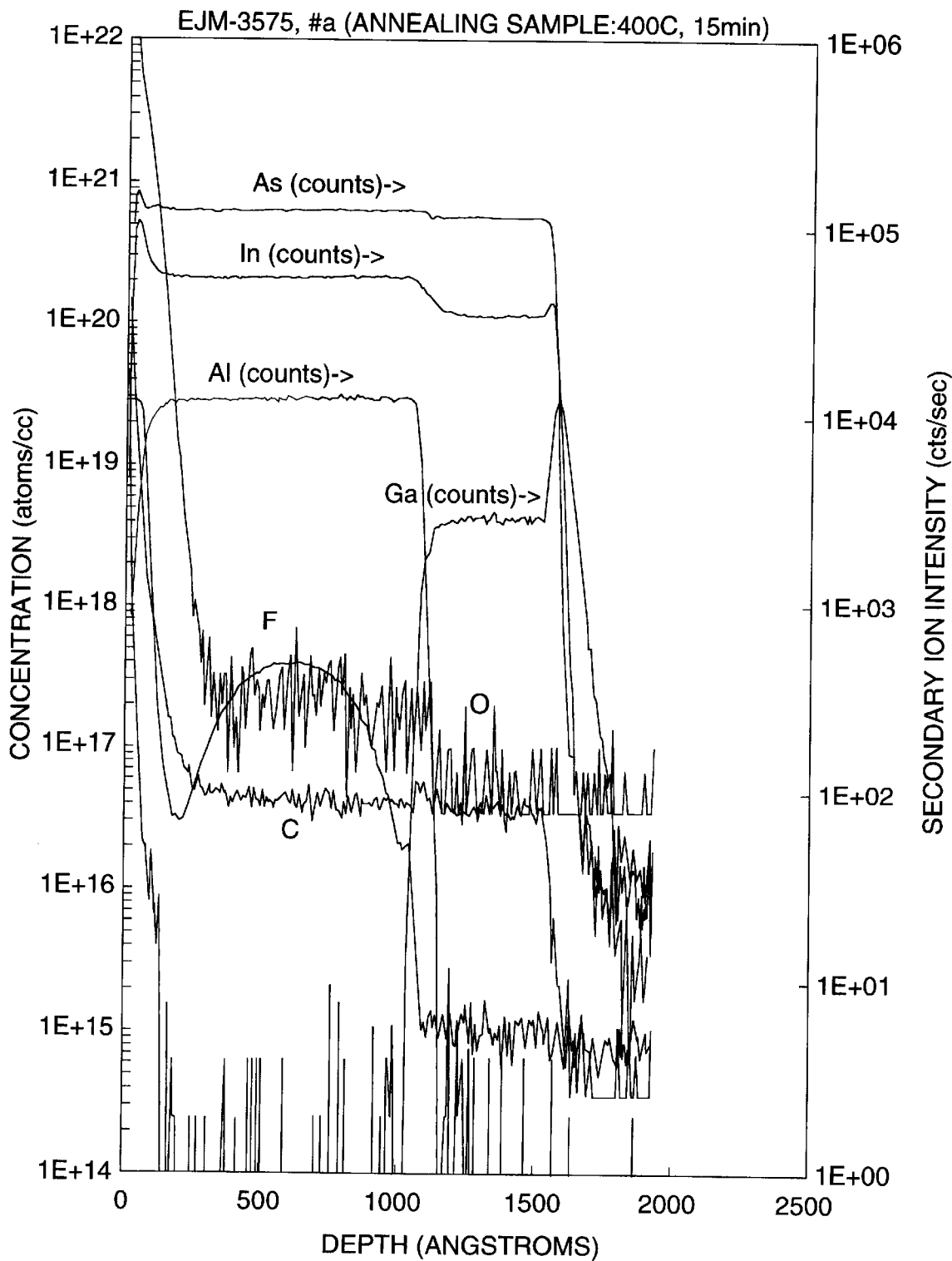
FIG. 6 is a graph showing result of measurement of F invasion at a compound semiconductor device made without plasma treatment for comparison.
Figure 7:
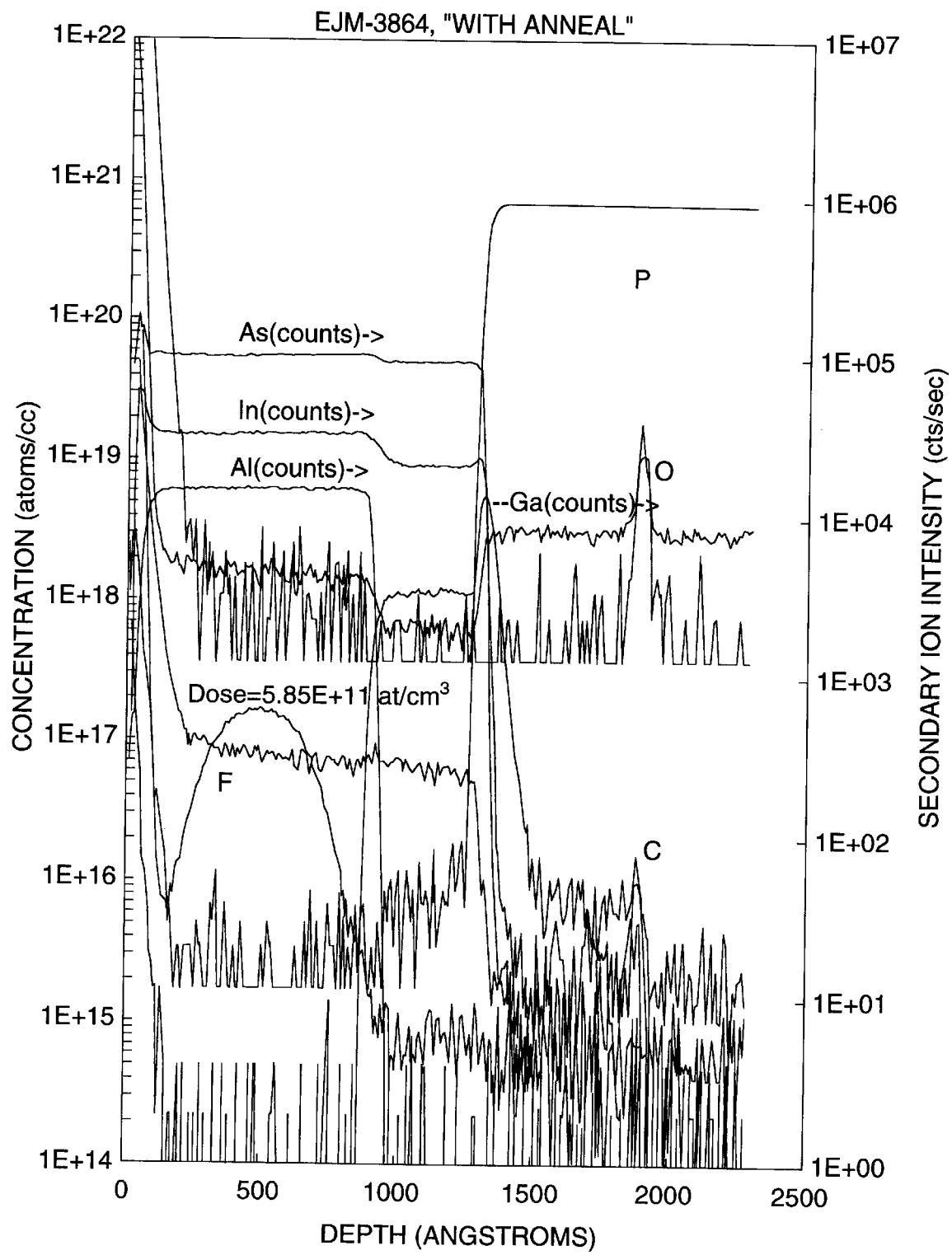
FIG. 7 is a graph showing result of measurement at a compound semiconductor made carrying out only plasma treatment at high substrate temperature for comparison.
Figure 8:
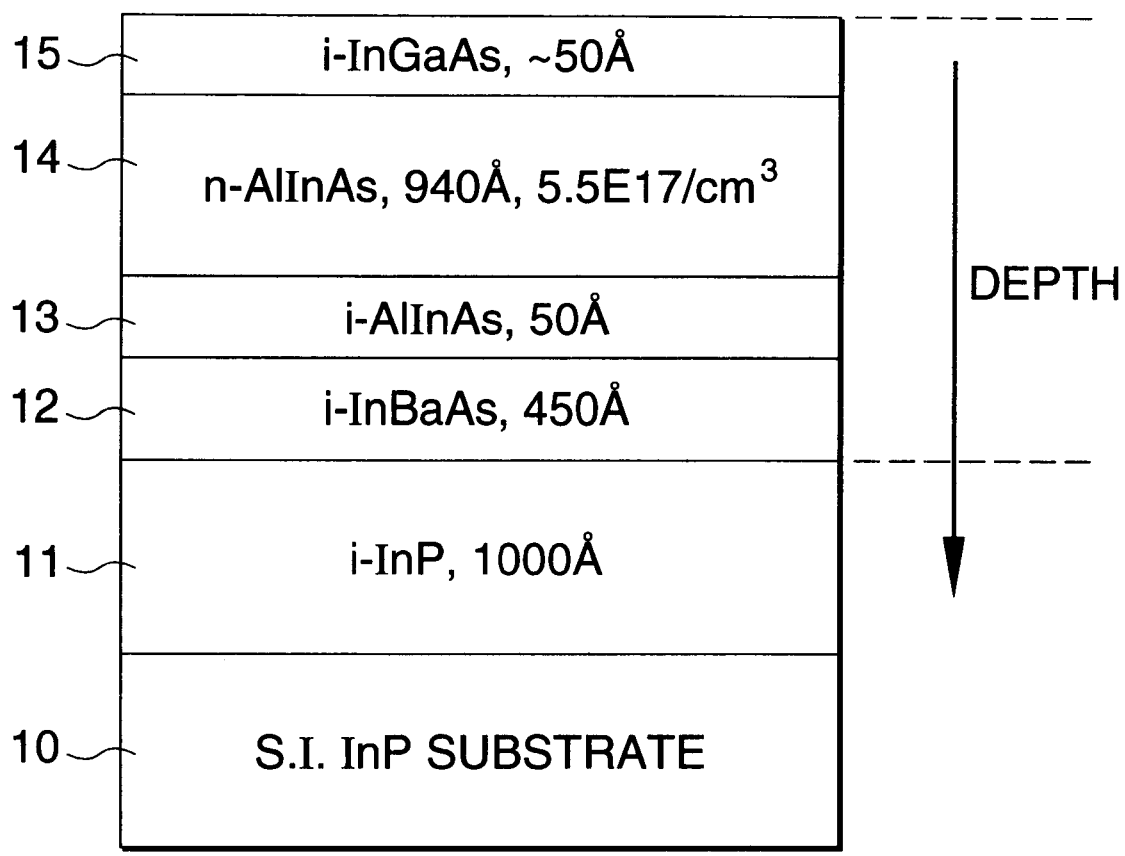
FIG. 8 is schematic showing the material and specification of the element of the sample used in the measurement.

FIG. 5 is a graph showing result of measurement of F invasion to gate domain at the HEMT manufactured by process including the plasma treatment carried out with condition shown in the following table 1. FIG. 8 shows the materials and specification of the element used in the measurement. As shown in FIG. 8, i-InP layer of 1000 Å in thickness, i-InGaAs layer of 450 Å in thickness, i-AlInAs layer of 50 Å in thickness, n-AlInAs layer 4 of 940 Å in thickness, i-InGaAs layer of 50 Å or more in thickness are deposited on S.I.InP substrate 10 one by one. The result of measuring the sample is shown in FIG. 6 that is made without the plasma treatment letting the material and specification of the element be same for comparison. Further, the result of measuring the sample is shown in FIG. 7 in case of carrying out only plasma treatment at high substrate temperature (250° C.) by phosphine letting the material and specification of the element be same too.

TABLE 1

| Plasma gas: | Phosphine ($PH_3$) |
|---|---|
| Low temperature plasma treatment; | |
| RF power: | 50 [w] |
| Gas pressure: | 0.2 [Torr] |
| Substrate temperature: | Room temperature |
| Treatment time: | 20 [minutes] |
| High temperature plasma treatment (Carried out continuously from the low temperature plasma treatment in the same chamber); | |
| RF power: | 50 [w] |
| Gas pressure: | 0.2 [Torr] |
| Substrate temperature: | 250 [° C.] |
| Treatment time: | 5 [minutes] |
| Annealing treatment; | |
| Substrate temperature: | 400 [° C.] |
| Treatment time: | 15 [minutes] |

RF power: 50[w]
Gas pressure: 0.2[Torr]
Substrate temperature: 250[° C.]
Treatment time: 5[minutes]
Annealing treatment;
Substrate temperature: 400[° C.]
Treatment time: 15[minutes]

As shown in FIGS. 5–7, remarkable F invasion is measured about not only a sample without carrying out plasma treatment but also a sample carrying out only high temperature plasma treatment. While it is found that F invasion is effectively depressed about a sample carrying out high temperature plasma treatment after low plasma treatment according to the invention.

Although the HEMT is described as an example in the above-mentioned mode, it is clear to apply the invention effectively for another compound semiconductor device of HBT in case of that compound semiconductor material including AlAs or InAs exposes in air at the manufacturing process.

What is claimed is:

1. A method for manufacturing a compound semiconductor device, said method comprising:

carrying out a first plasma treatment exposing a surface of a compound semiconductor material including AlAs or InAs which exposes in atmosphere at a manufacturing process of said compound semiconductor device, in plasma of gas including one of P (phosphorus), N (nitrogen), H (hydrogen), and Ar (argon) at a first substrate temperature which has a low temperature so as to depress an invasion of F (fluorine) to the compound semiconductor material.

2. The method for manufacturing compound semiconductor device according to claim 1, comprising:

carrying out a second plasma treatment by exposing the compound semiconductor material in plasma of gas including p at a second substrate temperature, which is higher than the first substrate temperature, continuously after said first plasma treatment without taking the compound semiconductor material out in air.

3. The method for manufacturing compound semiconductor device according to claim 1, wherein said first substrate temperature is less than 200° C. when an activation energy of F invasion is 1.0 eV.

4. The method for manufacturing compound semiconductor device according to claim 2, wherein said second substrate temperature is more than 250° C.

5. The method for manufacturing compound semiconductor device according to claim 1, wherein said first plasma treatment is carried out before loading a metal electrode layer on the compound semiconductor material.

6. The method for manufacturing compound semiconductor device according to claim 5, comprising:

carrying out a second plasma treatment exposing the compound semiconductor material in plasma of gas including p at a second substrate temperature, which is higher than the first substrate temperature, wherein said second plasma treatment is carried out continuously after said first plasma treatment without taking the compound semiconductor material out in air before loading the metal electrode layer.

7. The method for manufacturing compound semiconductor device according to claim 6, comprising:

spattering the surface of compound semiconductor material being carried out said first and second plasma treatments before loading said metal electrode layer;

loading the metal electrode layer on the compound semiconductor material; and carrying out the second plasma treatment again, continuously after loading the metal electrode layer without exposing the compound semiconductor material in air.

8. The method for manufacturing compound semiconductor device according to claim 1, wherein said first plasma treatment is carried out before forming a non-conductive coat on said compound semiconductor material.

9. The method for manufacturing compound semiconductor device according to claim 8, comprising:

carrying out a second plasma treatment by exposing the compound semiconductor material in plasma of gas including p at a second substrate temperature, which is higher than the first substrate temperature, wherein said second plasma treatment is carried out continuously after said first plasma treatment without taking the compound semiconductor material out in air before forming the non-conductive coat.

10. The method for manufacturing compound semiconductor device according to claim 3, wherein said first plasma treatment within one hour is carried out.

* * * * *